(12) United States Patent
Kim et al.

(10) Patent No.: US 7,209,721 B2
(45) Date of Patent: Apr. 24, 2007

(54) SINGLE SIDEBAND MIXER AND METHOD OF EXTRACTING SINGLE SIDEBAND SIGNAL

(75) Inventors: Young-jin Kim, Yongin (KR); Hae-moon Seo, Yongin (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 426 days.

(21) Appl. No.: 10/613,439

(22) Filed: Jul. 3, 2003

(65) Prior Publication Data
US 2004/0053594 A1    Mar. 18, 2004

(30) Foreign Application Priority Data
Sep. 17, 2002   (KR)   ............... 10-2002-0056625

(51) Int. Cl.
H04B 1/26    (2006.01)
(52) U.S. Cl. .............. 455/203; 455/323; 329/357
(58) Field of Classification Search ........... 455/323, 455/339, 47, 46, 109, 203; 329/357; 332/170
See application file for complete search history.

(56) References Cited

U.S. PATENT DOCUMENTS 4,193,035 A *   3/1980   Berger ............... 455/203
4,642,675 A *   2/1987   Gassmann ............ 348/727
5,901,347 A *   5/1999   Chambers et al. ..... 455/234.1

* cited by examiner

Primary Examiner—Edward F. Urban
Assistant Examiner—Adeel Haroon
(74) Attorney, Agent, or Firm—F.Chau & Associates, LLC

(57) ABSTRACT

Single sideband (SSB) mixers and methods of extracting a SSB signal, which are capable of outputting a single frequency using a plurality of mixers and a local oscillating frequency without having to implement phase-shifting. In one embodiment, a single sideband (SSB) mixer comprises a first mixer and a second mixer, wherein the first and second mixers multiply an input IF (intermediate frequency) signal by a local IF signal having the same frequency of the input IF signal; a band-pass filter which passes upper sideband signal output from the first mixer; a third mixer which multiplies the upper sideband signals output from the band-pass filter by a LO (local oscillating) signal; a fourth mixer which multiplies the signals output from the second mixer by the LO signal; and a subtraction device that subtracts output signals of the third mixer from output signals of the fourth mixer. Accordingly, a quadrature local oscillator which displaces a phase of a local oscillating signal by 90° at a high frequency is not required. Also, since the SSB mixer applies the same local oscillating frequency signal to each mixer, the rejection characteristics against undesired signals can be achieved to a level of about 70 dB, experimentally.

12 Claims, 4 Drawing Sheets

SINGLE SIDEBAND MIXER AND METHOD OF EXTRACTING SINGLE SIDEBAND SIGNAL

CROSS-REFERENCE TO RELATED APPLICATION

This application claims priority to Korean Patent Application No. 2002-56625, filed on Sep. 17, 2002, in the Korean Intellectual Property Office, the disclosure of which is incorporated herein in its entirety by reference.

TECHNICAL FIELD OF THE INVENTION

The present invention relates to SSB (single sideband) mixers and methods for extracting SSB signals from IF (intermediate frequency) signals. More specifically, the invention relates to SSB mixers and methods for extracting SSB signal, which do not implement phase-shifting.

BACKGROUND

In general, Amplitude Modulation is a process of combining a modulating signal with a carrier signal to produce an amplitude modulated signal. In the frequency spectrum, the amplitude modulated signal appears as discrete upper and lower sidebands, which are the sum and difference frequencies of the carrier and the modulating signal. The frequencies above the carrier frequency are collectively referred to as the "upper sideband" and the frequencies below the carrier frequency are referred to as the "lower sideband". The upper and lower side bands include the same amount of information.

Transmission of both the upper and lower sidebands, with the carrier suppressed/reduced, is referred to as DSB (double sideband) transmission, and requires significant bandwidth. The transmission of one of the sidebands is referred to as SSB (single sideband) transmission, which is accomplished by suppressing the carrier and eliminating one sideband using a filter, requires less bandwidth than DSB. Voice or musical signals may be transmitted using only SSB modulation, because such signals contain a small number of signal components in a low frequency band. However, a TV signal has a significant number of signal components at a still lower frequency band, and thus, transmission of a TV signal using SSB modulation results in a great loss of information. For this reason, vestigial sideband (VSB) modulation is used to transmit TV signals, which is compromise between DSB and SSB, wherein portions of one of the redundant sidebands are removed to form a vestigial sideband signal.

Typically, a ring modulator or a balanced modulator is implemented for performing SSB modulation. A balanced modulator or ring modulator receives as input a carrier frequency (LO signal) and a modulating signal and generates a double sideband signal with a suppressed carrier. To obtain an SSB signal for SSB transmission, a balanced modulator is used to suppress/reduce the carrier signal and the output of the balanced modulator is filtered using a band-pass filter to remove either the upper or lower sideband to produce an IF (intermediate frequency signal).

On the receiving side, if a signal having an intermediate frequency (IF) as the frequency of a carrier wave, is input to an up-conversion mixer in the receiver, a local oscillating frequency LO allows the mixer to output two components such as LO+IF and LO−IF. If the LO−IF is a desired signal, namely, the data, the LO+IF is an undesired image signal that should be eliminated.

FIG. 1 is a circuit diagram of a conventional SSB mixer. Referring to FIG. 1, the conventional SSB mixer includes a first mixer 10, a second mixer 11, a phase-shifting unit 12, and an adder 13. A IF (intermediate frequency) signal having a frequency of cos $(\omega_{IF}t)$ and a signal having a frequency of cos $(\omega_{LO}t)$ (which is an LO signal that is phase-shifted by 90° by the phase-shifting unit 12) are input to the first mixer 10. Then, the first mixer 10 outputs signals having frequencies of $\omega_{LO}+\omega_{IF}$ and $\omega_{LO}-\omega_{IF}$.

A signal having a frequency of sin $(\omega_{IF}t)$ (which is an out-of-phase component of the IF signal) and a local oscillating frequency sin $(\omega_{LO}t)$ are input to the second mixer 11. The second mixer 11 outputs signals having a frequencies of $-(\omega_{LO}+\omega_{IF})$ and $\omega_{LO}-\omega_{IF}$.

The adder 13 adds the outputs of the mixers 10 and 11, and then outputs only one frequency component $\omega_{LO}-\omega_{IF}$.

The SSB mixer of FIG. 1 has disadvantages in that the mixer requires a 90° phase-shifting device at a high frequency. That is, unless the phase of a signal is displaced precisely by 90°, the image component is not completely removed. Accordingly, the use of such a conventional SSB mixer exhibits rejection characteristics of about 30–40 dB with respect to the image component.

SUMMARY OF THE INVENTION

The present invention provides single sideband (SSB) mixers and methods of extracting a SSB signal, which are capable of outputting a single frequency using a plurality of mixers and a local oscillating frequency without having to implement phase-shifting.

According to one embodiment of the invention, a SSB mixer comprises a first mixer and a second mixer, wherein the first and second mixers multiply an input IF (intermediate frequency) signal by a local IF signal having the same frequency of the input IF signal, a band-pass filter which passes upper sideband signal output from the first mixer, a third mixer which multiplies the upper sideband signals output from the band-pass filter by a LO (local oscillating) signal, a fourth mixer which multiplies the signals output from the second mixer by the LO signal, and a subtraction device that subtracts output signals of the third mixer from output signals of the fourth mixer. The output of the subtraction device comprises a signal having the same frequency as the LO signal.

A variable gain amplifier may be operatively connected between the second and fourth mixers for adjusting the gain and phase of signals output from the second mixer. Preferably, the SSB mixer comprises means for generating the local IF signal and the LO signal.

In another embodiment of the invention, a SSB mixer comprises a first mixer for multiplying a first input IF signal by a local IF signal having the same frequency of the input IF signal; a second mixer for multiplying the local IF signal by a second input IF signal, wherein the second IF input signal is the same as the first input IF signal but opposite in phase; a band-pass filter which passes upper sideband signals output from the first mixer; a third mixer which multiplies signals output from the band-pass filter by a LO signal; a fourth mixer which multiplies signals output from the second mixer by the LO signal; and an adding device which adds signals output from the third and fourth mixers. The output of the adding device comprises a signal having the same frequency as the LO signal.

In yet another embodiment of the invention, a SSB mixer comprises a first mixer which multiplies an input IF signal by a local IF signal having the same frequency as the input IF signal; a low pass filter which passes a base band signal output from the first mixer; and a second mixer which multiplies the base band signal by a LO signal. The second mixer outputs a signal having the same frequency as the LO signal.

In another embodiment of the invention, a method of extracting a SSB signal comprises the steps of: (a) multiplying an input IF signal by a local IF signal having the same frequency of the input IF signal to generate an upper sideband and lower sideband of frequencies, the upper sideband comprising a signal equal in frequency to the sum of the frequencies of the input IF signal and the local IF signal, and the lower side band comprising a signal equal in frequency to the difference between the frequencies of the input IF signal and the local IF signal; (b) multiplying said upper sideband by a LO (local oscillating) signal to generate first output signals; (c) multiplying said upper and lower sidebands by the LO signal to generate second output signals; and (d) subtracting the first output signals from the second output signals to obtain a single frequency signal.

In yet another embodiment, a method of extracting a SSB signal comprises the steps of: (a) multiplying an input IF signal by a local IF signal having the same frequency of the input IF signal to generate a first upper sideband and a first lower sideband of frequencies, the first upper sideband comprising a signal equal in frequency to the sum of the frequencies of the input IF signal and the local IF signal, and the first lower sideband comprising a signal equal in frequency to the difference between the frequencies of the input IF signal and the local IF signal; (b) filtering the signals obtained in step (a) to output only said first upper sideband; (c) inverting the input IF signal and multiplying the inverted input IF signal by the local IF signal to generate a second upper sideband and a second lower sideband of frequencies, the second upper sideband comprising a signal equal in frequency to the sum of the frequencies of the inverted input IF signal and the local IF signal, and the second lower side band comprising a signal equal in frequency to the difference between the frequencies of the inverted input IF signal and the local IF signal; (d) multiplying said first upper sideband obtained in step (b) by a LO signal; (e) multiplying said second upper sideband and said second lower sideband obtained in step (c) by the LO signal; and (f) adding signals obtained in steps (d) and (e) and outputting a single frequency signal.

In another embodiment of the invention, a method of extracting a SSB signal comprises the steps of: (a) multiplying an input IF signal by a local IF signal having the same frequency as the input IF signal to generate a plurality of signals; (b) extracting a base-band signal from the plurality of signals generated in step (a); and (c) multiplying the base-band signal by a LO (local oscillating) signal and outputting a single frequency signal.

These and other embodiment, aspects, objects, features, and advantages of the present invention will be described or become apparent from the following detailed description of preferred embodiments, which is to be read in connection with the accompanying drawings.

DETAILED DESCRIPTION OF PREFERRED EMBODIMENTS

Figure 1:
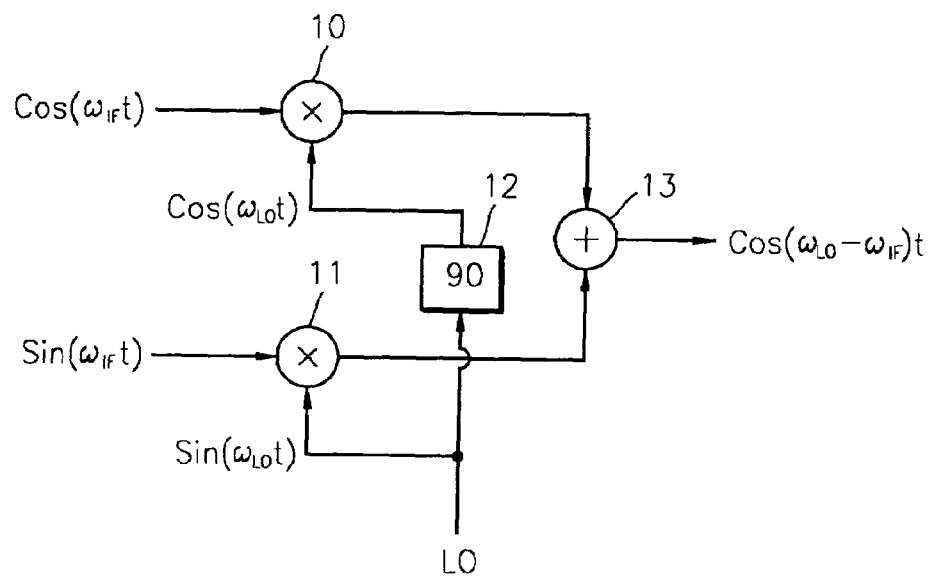
FIG. 1 schematically illustrates a conventional single sideband mixer.
Figure 2:
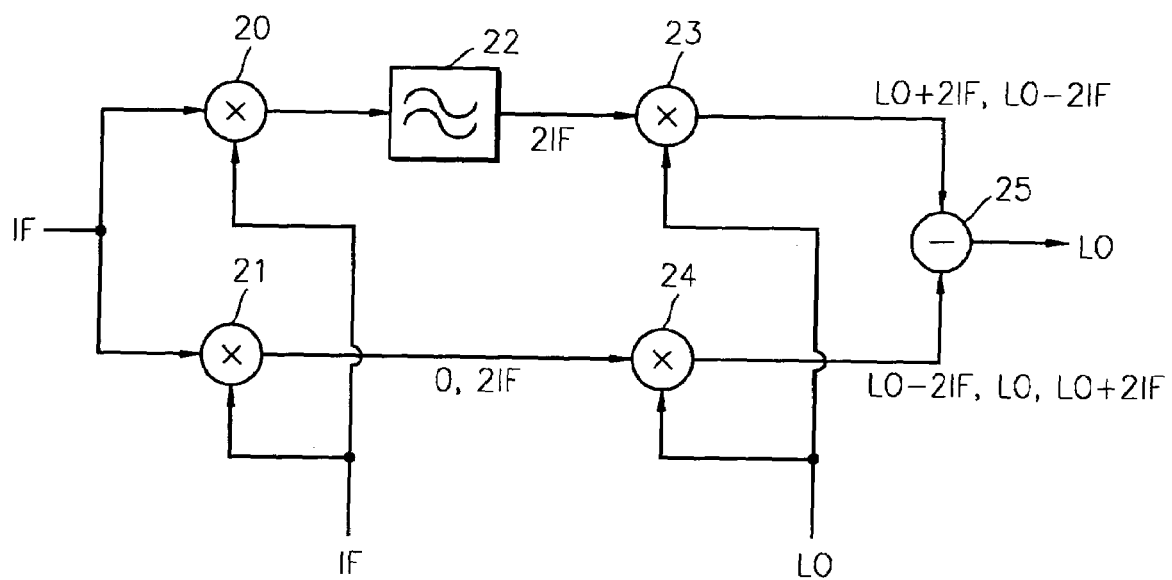
FIG. 2 schematically illustrates a single sideband mixer according to an embodiment of the present invention.

FIG. 2 schematically illustrates a single sideband (SSB) mixer according to an embodiment of the invention. The SSB mixer comprises a first mixer 20, a second mixer 21, a band-pass filter (BPF) 22, a third mixer 23, a fourth mixer 24, and a subtracter 25. It is to be understood that FIG. 2 further depicts a flow diagram of a method for extracting an SSB signal from an input IF signal according to one aspect of the invention.

Figure 3:
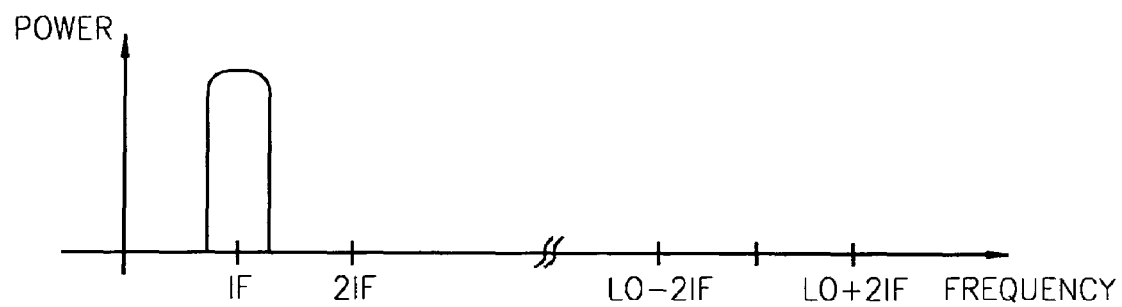
FIG. 3 is an exemplary diagram illustrating a frequency spectrum of an intermediate frequency that is input to the single sideband mixer of FIG. 2.
Figure 4:
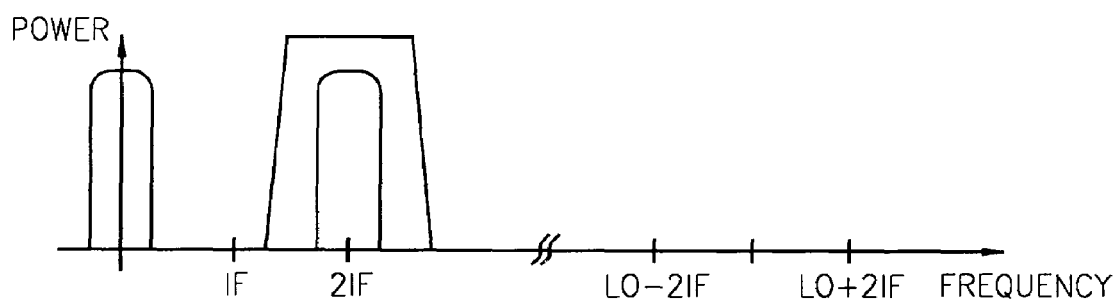
FIG. 4 is an exemplary diagram illustrating a frequency spectrum of the signals output from first and second mixers of FIG. 2.
Figure 5:
FIG. 5 is an exemplary diagram illustrating a frequency spectrum of a signal output from a band-pass filter of FIG. 2.
Figure 6:
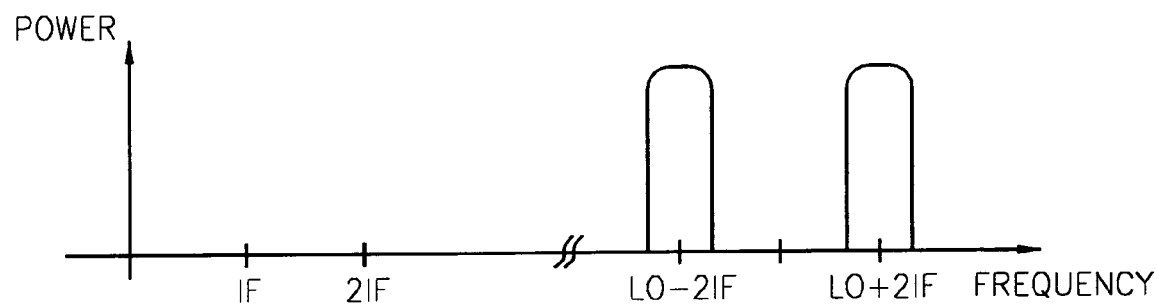
FIG. 6 is an exemplary diagram illustrating a frequency spectrum of a signal output from a third mixer of FIG. 2.
Figure 7:
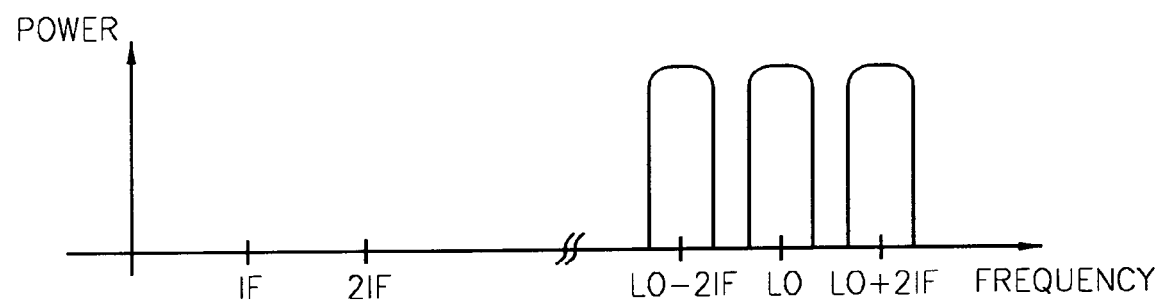
FIG. 7 is an exemplary diagram illustrating a frequency spectrum of a signal output from a fourth mixer of FIG. 2.
Figure 8:
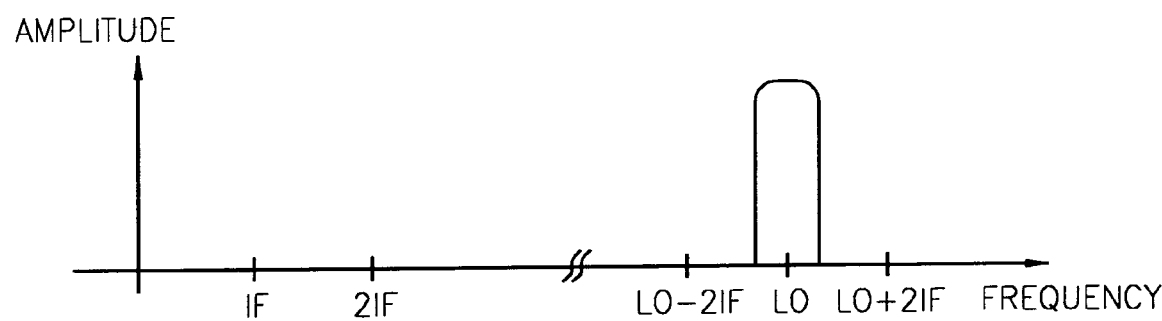
FIG. 8 is an exemplary diagram illustrating a frequency spectrum of a signal output from a subtracter of FIG. 2.

The first and second mixers 20 and 21 multiply an input IF (intermediate frequency) signal by a local IF signal (which is preferably generated by an IF oscillator of the SSB mixer) and output signals having frequencies of 0, 2IF. The spectrum of the IF signal is illustrated in FIG. 3. The signals output from the first and second mixers 20 and 21 have spectrums that have predetermined powers at frequencies of 0 and 2IF, respectively, as illustrated in FIG. 4. The BPF 22 passes the frequency of 2IF (upper sideband) and filters out the frequency of 0 (lower sideband), as shown in FIG. 5. The third mixer 23 multiplies the signal having frequency 2IF and a LO (local oscillating) signal having frequency LO (which is preferably generated by a local oscillator of the SSB mixer), and outputs signals having frequencies of LO+2IF and LO−2IF. The spectrums of these frequencies of LO+2IF and LO−2IF are as shown in FIG. 6. The fourth mixer 24 multiplies the signals having frequencies of 0 and 2IF by the local oscillating frequency LO and outputs signals having frequencies of LO−2IF, LO, and LO+2IF. The spectrums of these frequencies are as shown in FIG. 7. The subtracter 25 subtracts an output of the third mixer 23 from an output of the fourth mixer 24 and outputs only the local oscillating frequency LO. That is, the output of the subtracter 25 has a single frequency spectrum as shown in FIG. 8. Here, a variable gain amplifier may be operatively connected between the second and fourth mixers 21 and 24 to adjust the gain and phase of the signals output from the second mixer 21 to improve the subtraction operation at a high frequency. If the local oscillating frequency LO is replaced with a desired frequency and input to the third and fourth mixers 23 and 24, it is possible to make the subtracter 25 output the desired frequency.

Figure 9:
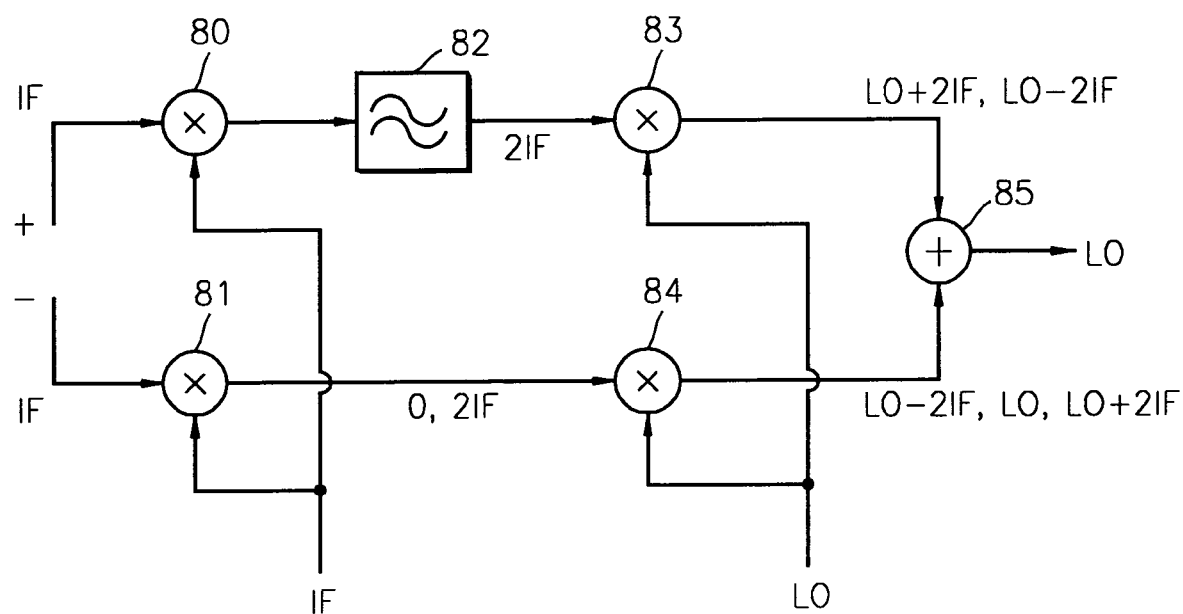
FIG. 9 schematically illustrates a single sideband mixer according to another embodiment of the invention.

FIG. 9 schematically illustrates a SSB mixer according to another embodiment of the present invention. The SSB mixer comprises a first mixer 80, a second mixer 81, a BPF 82, a third mixer 83, a fourth mixer 84, and an adder 85. It is to be understood that FIG. 9 further depicts a flow diagram of a method for extracting a SSB signal from an input IF signal according to another aspect of the invention.

The first mixer 80 multiplies a first input IF signal by a local IF signal (which has the same frequency as the first input IF signal) and outputs signals having frequencies 0 and 2IF. The local IF signal is preferably generated by a local oscillator of the SSB mixer. A second IF signal (−) (which is generated by inverting the first input IF signal (+) to have a phase difference of 180 degrees (opposite phase) with respect to the first IF signal (+)) is input to the second mixer 81. The second mixer 81 multiplies the second IF signal (−) with the local IF signal and outputs a signal having frequencies 0 and 2IF, whose phases are opposite to the first input IF signal (+). The BPF 82 filters that output signals form the first mixer 80 by passing the signal having frequency of 2IF (upper sideband) and filtering out the signal having the frequency of 0 (lower sideband). The third mixer 83 multiplies the signal having the frequency 2IF by a LO signal having a local oscillating frequency LO (which is preferably generated by a local oscillator of the SSB mixer), and then outputs signals having frequencies of LO+2IF and LO−2IF. The fourth mixer 84 multiplies the signals having frequencies of 0 and 2IF output from the second mixer 81 by the local oscillating frequency LO, and then outputs signals having frequencies of LO−2IF, LO, and LO+2IF, whose phases are opposite to the phase of the first input IF signal (+). The adder 85 adds signals output from the third and fourth mixers 83 and 84, and outputs a signal of a single frequency of LO.

As described above with reference to FIG. 2, a variable gain amplifier (not shown) may be operatively connected between the second and fourth mixers 81 and 84 to adjust the gain and phase of the signals output from the second mixer 81.

Figure 10:
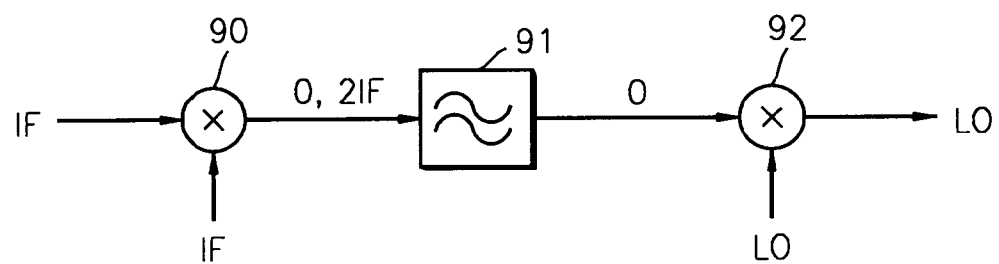
FIG. 10 schematically illustrates a single sideband mixer according to another embodiment of the present invention.

FIG. 10 schematically illustrates a SSB mixer according to another embodiment of the present invention. The SSB mixer comprises a first mixer 90, a low pass filter 91, and a second mixer 92. It is to be understood that FIG. 10 further depicts a method for extracting an SSB signal from an IF signal according to another aspect of the invention.

The first mixer 90 multiplies an input IF signal by a local IF signal output from an IF oscillator (which is preferably a component of the SSB mixer) which oscillates the same frequency as the input IF signal, and outputs frequencies of 0 and 2IF. The low pass filter 91 passes a base band signal among signals output from the first mixer 90. The second mixer 92 multiplies the base band signal by a LO (local oscillating) signal having a frequency LO and outputs a signal having the local oscillating frequency. The SSB preferably comprise a local oscillator for generating the LO signal.

In summary, a single sideband (SSB) mixer according to the present invention is capable of outputting a single frequency without having to implement a quadrature local oscillator which displaces a phase of a local oscillating signal by 90° at a high frequency. Also, since a SSB mixer according to the present invention applies the same local oscillating frequency signal to each mixer, the rejection characteristics against undesired signals can be achieved to a level of about 70 dB, experimentally.

Although illustrative embodiments have been described herein with reference to the accompanying drawings, it is to be understood that the invention is not limited to the precise system and method embodiments described herein, and that various other changes and modifications may be affected therein by one skilled in the art without departing form the scope or spirit of the invention. All such changes and modifications are intended to be included within the scope of the invention as defined by the appended claims.

What is claimed is:

1. A single sideband (SSB) mixer, comprising:
    a first mixing portion which receives a first input signal and a second input signal, multiplies each of the first and second input signals by a non phase-shifted local IF (intermediate frequency) signal, and outputs a first output signal and a second output signal;
    a band-pass filter which passes upper sideband signal of the first output signal;
    a second mixing portion which receives the band-passed signal and the second output signal, multiplies each of the band-passed signal and the second output signal by an non phase-shifted LO (local oscillating) signal, and outputs a third signal and a fourth signal: and
    an operating portion which performs a predetermined operation on the third and fourth signals to output a signal having the same frequency as the LO signal.

2. The SSB mixer of claim 1, wherein the first mixing portion comprises a first mixer and a second mixer whose input signals are an input IF signal having the same frequency as the local IF signal and wherein the second mixing portion comprises a third mixer and a fourth mixer whose input signals are the band-passed signal and the second output signal, respectively.

3. The SSB mixer of claim 2, further comprising a variable gain amplifier, operatively connected between the second and fourth mixers, for adjusting the gain and phase of signals output from the second mixer.

4. The SSB mixer of claim 2, further comprising means for generating the local IF signal and the LO signal.

5. The SSB mixer of claim 2, wherein the operating portion is a subtraction device.

6. The SSB mixer of claim 1, where the first mixing portion comprises a first mixer and a second mixer whose input signals are an input IF signal and an input IF signal but opposite in phase and wherein the second mixing portion comprises a third mixer and a fourth mixer whose input signals are the band-passed signal and the second output signal, respectively.

7. The SSB mixer of claim 6, further comprising a variable gain amplifier, operatively connected between the second and fourth mixers, for adjusting the gain and phase of the signals output from the second mixer.

8. The SSB mixer of claim 6, further comprising means for generating the local IF signal and the LO signal.

9. The SSB mixer of claim 6, wherein the operating portion is an adding device.

10. A method of extracting a single sideband (SSB) signal, comprising:
    multiplying a first input signal and a second input signal by a non phase-shifted local IF (intermediate frequency) signal to output a first output signal and a second output signal;
    band-pass filtering an upper sideband signal of the first output signal;
    multiplying the upper sideband signal and the second output signal by a non phase-shifted LO (local oscillating) signal to output a third signal and a fourth signal; and
    processing the third and fourth signals to output a signal having the same frequency as the LO signal.

11. The method of claim 10, wherein the first and second input signals are an IF signal having the same frequency as the local IF signal.

12. The method of claim 10, wherein the first input signal is an IF signal having the same frequency as the local IF signal and the second input signal is an IF signal having the same frequency as the local IF signal but opposite in phase.

* * * * *